(12) United States Patent
Whitted et al.

(10) Patent No.: US 9,565,783 B1
(45) Date of Patent: Feb. 7, 2017

(54) MODULAR DATA CENTER (71) Applicant: Google Inc., Mountain View, CA (US)

(72) Inventors: William H. Whitted, Woodside, CA (US); Gerald Aigner, Pfaeffikon (CH)

(73) Assignee: Google Inc., Mountain View, CA (US)

( * ) Notice: Subject to any disclaimer, the term of this patent is extended or adjusted under 35 U.S.C. 154(b) by 600 days.

(21) Appl. No.: 14/046,078

(22) Filed: Oct. 4, 2013

Related U.S. Application Data (63) Continuation of application No. 12/165,506, filed on Jun. 30, 2008, now Pat. No. 8,549,869, which is a continuation of application No. 11/869,586, filed on Oct. 9, 2007, now abandoned, which is a continuation of application No. 10/750,330, filed on Dec. 30, 2003, now Pat. No. 7,278,273.

(51) Int. Cl.
*H05H 7/14* (2006.01)
*H05K 7/14* (2006.01)
*H01R 43/26* (2006.01)

(52) U.S. Cl.
CPC ............ *H05K 7/1497* (2013.01); *H01R 43/26* (2013.01)

(58) Field of Classification Search
CPC ...................... H05K 7/1497; F28D 2021/0028
USPC ........ 361/690, 691, 694–696, 698; 165/80.2, 165/80.3, 104.33; 62/259.2
See application file for complete search history.

(56) References Cited

U.S. PATENT DOCUMENTS

| | | | |
|---|---|---|---|
| 3,777,506 A | 12/1973 | Hergatt et al. | |
| 3,889,746 A | 6/1975 | Laffranchi | |
| 3,925,679 A | * 12/1975 | Berman | E04B 1/3483 290/1 R |
| 4,549,405 A | * 10/1985 | Anderson | B60H 1/00014 62/239 |
| 5,203,500 A | 4/1993 | Horne | |
| 5,544,012 A | 8/1996 | Koike | |
| 5,722,483 A | 3/1998 | Gibson | |
| 5,740,018 A | 4/1998 | Rumbut | |
| 5,788,858 A | 8/1998 | Acernese et al. | |
| 5,924,581 A | 7/1999 | Chen | |
| 6,025,788 A | 2/2000 | Diduck | |

(Continued)

OTHER PUBLICATIONS

Designing & Building Efficient Data Centers, PlanetTen, Jul. 2003 (23 pages).

(Continued)

*Primary Examiner* — Marc Norman
(74) *Attorney, Agent, or Firm* — Fish & Richardson P.C.

(57) ABSTRACT

Modular data centers with modular components suitable for use with rack or shelf mount computing systems, for example, are disclosed. The modular center generally includes a modular computing module including an intermodal shipping container and computing systems mounted within the container and configured to be shipped and operated within the container and a temperature control system for maintaining the air temperature surrounding the computing systems. The intermodal shipping container may be configured in accordance to International Organization for Standardization (ISO) container manufacturing standards or otherwise configured with respect to height, length, width, weight, and/or lifting points of the container for transport via an intermodal transport infrastructure. The modular design enables the modules to be cost effectively built at a factory and easily transported to and deployed at a data center site.

25 Claims, 4 Drawing Sheets

(56) References Cited

U.S. PATENT DOCUMENTS

| | | | |
|---|---|---|---|
| 6,034,873 | A | 3/2000 | Ståhl et al. |
| 6,176,046 | B1 | 1/2001 | Quine et al. |
| 6,374,627 | B1 | 4/2002 | Schumacher et al. |
| 6,407,567 | B1 | 6/2002 | Etter |
| 6,412,292 | B2 | 7/2002 | Spinazzola et al. |
| 6,494,050 | B2 | 12/2002 | Spinazzola et al. |
| 6,506,111 | B2 | 1/2003 | Sharp et al. |
| 6,530,347 | B2 | 3/2003 | Takahashi et al. |
| 6,601,542 | B2 | 8/2003 | Campion |
| 6,652,373 | B2 | 11/2003 | Sharp et al. |
| 6,672,955 | B2 | 1/2004 | Charron |
| 6,775,137 | B2 | 8/2004 | Chu et al. |
| 6,786,056 | B2 | 9/2004 | Bash et al. |
| 6,819,563 | B1 | 11/2004 | Chu et al. |
| 6,859,366 | B2 | 2/2005 | Fink |
| 6,957,544 | B2 * | 10/2005 | Dobbs .............. F24F 11/053 165/80.3 |
| 7,170,745 | B2 | 1/2007 | Bash et al. |
| 7,309,279 | B2 | 12/2007 | Sharp et al. |
| 7,688,578 | B2 | 3/2010 | Mann et al. |
| 7,971,446 | B2 | 7/2011 | Clidaras et al. |
| 2002/0190868 | A1 | 12/2002 | Dearborn et al. |
| 2003/0050003 | A1 | 3/2003 | Charron |
| 2003/0053293 | A1 | 3/2003 | Beitelmal et al. |
| 2003/0147214 | A1 | 8/2003 | Patel et al. |
| 2004/0100770 | A1 | 5/2004 | Chu et al. |
| 2004/0132398 | A1 | 7/2004 | Sharp et al. |
| 2006/0082263 | A1 | 4/2006 | Rimler et al. |
| 2008/0094797 | A1 | 4/2008 | Coglitore et al. |

OTHER PUBLICATIONS

Baumgart et al., Petabyte Box for Internet Archive, Nov. 8, 2003 (6 pages).

* cited by examiner

MODULAR DATA CENTER

CROSS REFERENCE TO RELATED APPLICATIONS

This application is a continuation of, and claims priority under 35 U.S.C. §120 to, U.S. patent application Ser. No. 12/165,506 filed Jun. 30, 2008, now U.S. Pat. No. 8,549,869, which in turn is a continuation of U.S. patent application Ser. No. 11/869,586 filed Oct. 9, 2007, now abandoned, which in turn is a continuation of U.S. patent application Ser. No. 10/750,330 filed Dec. 30, 2003, now U.S. Pat. No. 7,278, 273, which are incorporated herein by reference in their entirety.

BACKGROUND OF THE INVENTION

1. Field of the Invention

The present invention relates generally to computing data centers. More specifically, modular data centers with modular components suitable for use with rack or shelf mount computing systems, for example, are disclosed.

2. Description of Related Art

Many of today's more complex computing systems such as computer server systems are often rack-mounted systems in which a number of removable electronics modules, such as electronics trays, are positioned and stacked relative to each other in a shelf-like manner within a frame or rack. Rack-mounted systems allow the arrangement of several of the electronics modules in a vertical orientation for efficient use of space. Each electronics module can be slid into and out of the rack-mounting system.

Each electronics module may correspond to a different server or each electronics module may hold one or more components of a server. Examples of electronics modules include modules for processing, storage such as random access memory (RAM), network interfaces and controllers, disk drives such as floppy disk drives, hard drives, compact disk (CD) drives, and digital video disk (DVD) drives, parallel and serial ports, small computer systems interface (SCSI) bus controllers, video controllers, power supplies, and so forth.

A server farm in today's computing environment may be housed in a data center such as a colocation and may include hundreds of racks that hold various types of computer-related modules. When the server racks are installed in the colocation site, a number of interrelated processes are planned out and executed, generally in a relatively short period of time. Examples of such processes include physical layout of the server racks, configuration and wiring of electrical power connections to the server racks, layout of flow-control elements in the cooling system of the data center space, and/or the installation of Internet connectivity wiring and networking systems. Typically, these processes are completed on-site at the colocation site by costly skilled tradesmen. In addition, because installation at each site is customized to take into account site-specific constraints, i.e., site to site variations in data centers, installation difficulties arise and economies of scale cannot be fully exploited on installations. Furthermore, because of the site-specific constraints, the processes are different for each site such that each site provides new opportunities for costly design and/or installation errors. Currently, the time from determining the need to starting to serve production traffic can be approximately 6 to 9 months.

To further increase the costs, many colocations are relatively expensive to use or lease and typically are not setup for convenient operations or for easy deployment of large scale server racks, for example. In large scale deployments, many potential opportunities to maximize power, cooling, ventilation, lighting, and space utilization, are not easily exploited at colocation sites. Colocations also often have issues associated with power, cooling, and/or personnel. Moreover, the available colocation sites may be limited.

As an example, a large scale deployment of a server farm such as a mega data center, may involve 300,000 computers, with a service life of approximately four years per machine. In such a large scale server farm, an average of over 1,400 computers per week are de-racked and racked just to keep pace with end-of-service machines. At a rack density of 40 trays per rack and 1 computer per tray, approximately 36 racks are replaced each week.

SUMMARY OF THE INVENTION

Modular data centers with modular components suitable for use with rack or shelf mount computing systems, for example, are disclosed. It should be appreciated that the present invention can be implemented in numerous ways, including as a process, an apparatus, a system, a device, or a method. Several inventive embodiments of the present invention are described below.

According to one embodiment, a modular data center generally includes a modular computing module including an intermodal shipping container and computing systems mounted within the container and configured to be shipped and operated within the container and a temperature control system for maintaining the air temperature surrounding the computing systems. The intermodal shipping container may be configured in accordance to International Organization for Standardization (ISO) container manufacturing standards or otherwise configured with respect to height, length, width, weight, and/or lifting points of the container for transport via an intermodal transport infrastructure. The modular design enables the modules to be factory built and easily transported to and deployed at a data center site.

For example, the intermodal shipping container may have a height of approximately 8 feet 6 inches or 9 feet 6 inches and a width of approximately 8 feet. The computing systems may be arranged for human access within the intermodal shipping container. The modular data center may also include an interconnecting module to interconnect modular computing modules, a power generating module for generating power for the modular computing module, and/or a cooling module for providing cooling for the temperature control system, each module being relatively self-contained within another intermodal shipping container. The modular components of the modular data center need not employ intermodal shipping containers of the same size. The cooling module may contain, for example, a compressor, a condensing coil, heat exchanger, pumps, controls, and/or motors for a temperature control system. The modular data center may additionally include an evaporative, compressed fluid, or other suitable cooling system in communication with the modular computing module.

The computing systems may be mounted within rack and/or shelf mounting structures and each mounting structure may be enclosed in an enclosure with an access door, each enclosure being associated with an independent temperature control subsystem. Each temperature control subsystem may include a blower and an evaporator coil, the blower including a blower motor and blower blades mounted external and internal to the intermodal shipping container, respectively. The enclosure may also define a delivery plenum and a return plenum in thermal communication with the corresponding temperature control subsystem and with the computing systems contained within the corresponding enclosure. The modular computing module may also include a gas-side economizer in thermal communication with the corresponding temperature control subsystem.

According to another embodiment, a data center may generally include a modular computing module including an intermodal shipping container configured for transport via an intermodal transport infrastructure with respect to height, length, width, weight, and/or lifting points of the container, computing systems mounted within the container and configured to be shipped and operated within the container, a power distribution unit configured to distribute power from a power source to the computing systems, and a network interface configured to interface between an Internet access connection and the computing systems, and a temperature control system for maintaining a predetermined air temperature surrounding the computing systems.

According to yet another embodiment, a method for deploying a data center generally includes building a modular computing module including an intermodal shipping container configured in accordance to ISO container manufacturing standards and/or configured for transport via an intermodal transport infrastructure and computing systems mounted within the intermodal container and configured to be shipped and operated within the intermodal container, transporting the modular computing module to a data center site via an intermodal transport infrastructure, and connecting a resource connection to the modular computing module.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Modular data centers with modular components suitable for use with rack or shelf mount computing systems, for example, are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
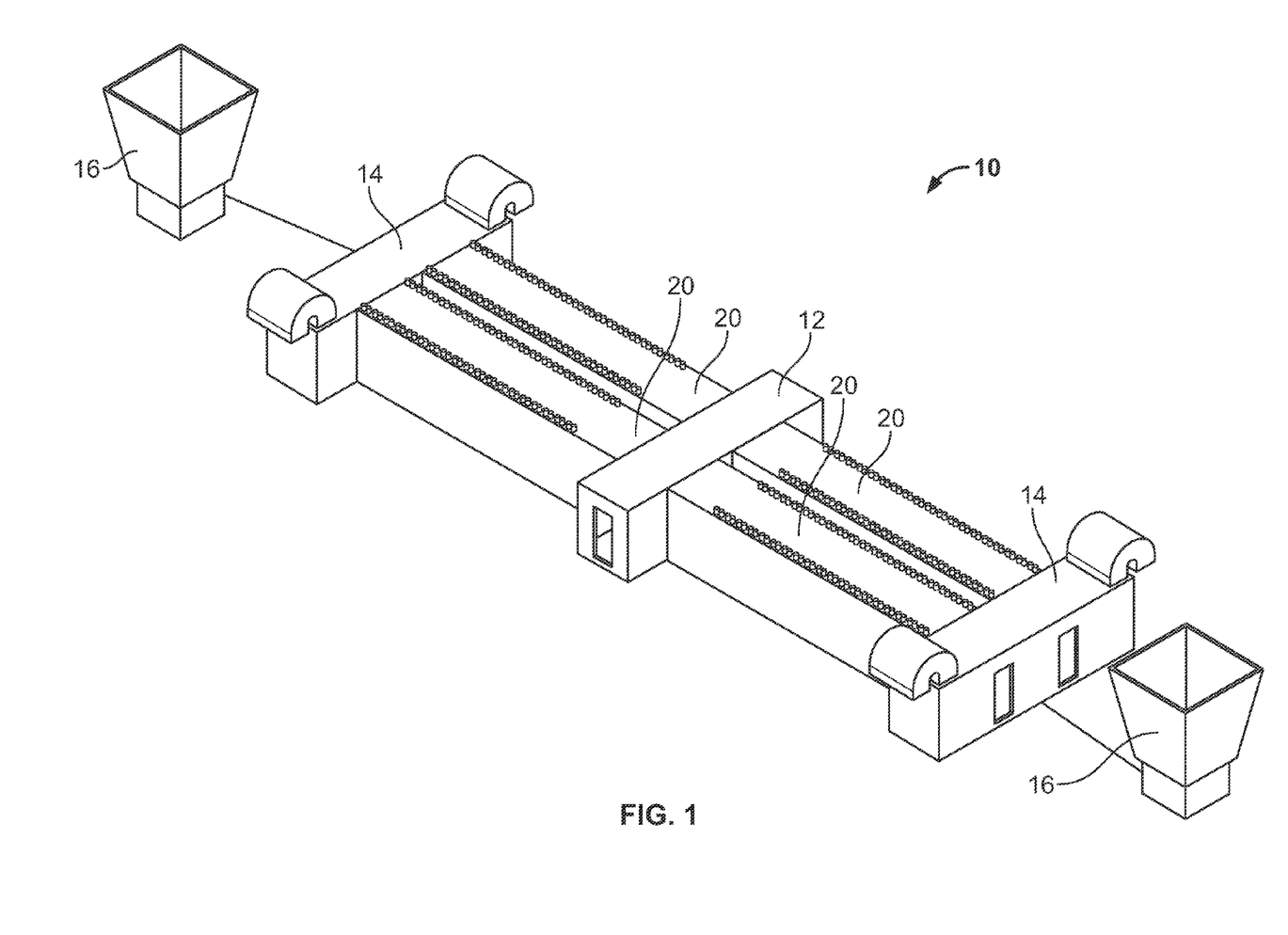
FIG. 1 is a perspective view of an illustrative implementation of a modular data center suitable for use with rack and/or shelf mount computing systems.

FIG. 1 is a perspective view of an illustrative implementation of a modular data center 10 suitable for use with rack and/or shelf mount computing systems. The modular data center 10 includes at least one computing module 20 each with multiple computing units contained in an intermodal shipping, e.g., dry van, container. In the example shown in FIG. 1, the modular data center 10 includes four computing modules 20 as well as an office module 12 interconnecting the four computing modules 20, optional power and cooling modules 14, and optional cooling towers 16 housing, e.g., condensers. The power and cooling module 14 may contain power generation equipment and most of the cooling equipment (e.g., compressor(s), heat exchangers, circulation pumps, controls, etc.). At sites with a nearby natural cooling mechanism, e.g., river, lake, or ocean, the natural cooling mechanism may be employed to cool the condensing of the cooling fluids. At certain locations that are very dry, e.g., Phoenix, Ariz., water may be sprayed onto the coils carrying the cooling fluids in the cooling tower 16 as air is blown past the coils. If the available air is sufficiently warm and dry, such a system may provide sufficient cooling.

Each of the computing modules 20, office module 12, and power and cooling modules 14 may include an intermodal shipping container such that each may be assembled in a factory and then both shipped and deployed in the intermodal shipping container. The intermodal shipping containers may be readily purchased, e.g., off the shelf, or may be custom or specially manufactured to standards for the intermodal shipping container industry with respect to, for example, size, maximum weight, lifting points, etc. Such use of standard modular shipping containers enables the data center components to easily fit into existing worldwide air, road (e.g., truck), rail, and/or vessel (e.g., ship and barge) container handling infrastructure that also includes standardized container handling hardware. In addition, the standard intermodal shipping containers are relatively inexpensive and robust while large enough to contain a good amount of computing and/or self-contained power conversion, cooling, and connectivity interfaces, etc. As the shipping container and its contents are shipped in the container itself and deployed with minimum, if any, additional on-site configuration, the various components within the container can be secured, e.g., with appropriate mounting apparatus, within the container, e.g., to the walls 205, floor 207, ceiling 209 and/or internal structure of the container and/or to each other.

Intermodal shipping containers, as used herein, refer to those that conform to International Standardization Organization (ISO) container manufacturing standards. In general, the intermodal shipping containers can be, for example, general purpose or dry, insulated, flat rack or platform, open top, refrigerated, or tank. General purpose containers, also referred to as cube containers, are enclosed, box-type containers used for general-purpose transportation. Cargo is typically loaded from one or both ends of the container. Insulated or thermal containers, with insulated walls but no refrigeration unit, are often used to transport chilled and frozen goods as well as temperature sensitive materials and products. Intermodal shipping containers also come in many other configurations, e.g., with one or more end and/or side doors and/or specially reinforced floors and/or frames for extra heavy loading. Generally, common container lengths used in international commerce include 20', 28', 40' and 48' as well as other sizes such as 10', 24', 44', 45', 46', 53', and 56'. Typical container height is 8'6" or 9'6" for high cube or extended height containers. The standard width for containers is 8'. Various other combinations of lengths, widths, and/or heights may also be employed. The containers may be made of, for example, steel, aluminum, or the like. Typically, because of weight constraints such as maximum load limits on highways, high density or heavy goods may be loaded in shorter containers. For example, in one implementation a 40' container with a full complement of computers, can weigh approximately 20,000 pounds as compared to a typical container rating of approximately 67,000 pounds. Intermodal shipping containers generally have fittings on the top and bottom which facilitate in their handling and that enable them to be stacked in terminals, on ships, and/or in operation. The fittings primarily include oval-shaped holes at the lift points. For transport, storage or operation, containers may be stacked and connected to each other with interbox connectors (IBCs), i.e., pieces of hardware that fit into the oval holes of the containers above and below and are turned to lock the two containers together.

It is to be appreciated that while the standard intermodal shipping containers enjoy the convenience and cost savings associated with the existing container handling infrastructure, many other form factors may be employed such as a mechanical structures capable of supporting large numbers of computers, provide sufficient level of environmental protection, and facilitate the connection of power and the Internet to the supported computers.

By shipping and also deploying the data center modules 12, 14, 16, 20 in the intermodal shipping containers, the components may be factory built and/or tested. Note that the cooling towers 16 may be shipped in the intermodal shipping containers and site-configured as needed. Building and testing the data center components in the intermodal shipping containers may be cost effectively achieved in a controlled environment of a centralized factory or other build facilities. Such factory building and testing reduces the cost and time associated with conventional installation at a collocation site with site-specific requirements and constraints that would also otherwise involve costly skilled tradesmen, particularly to complete the build-out of power, network wiring, and/or cooling systems. The data center components may also enjoy the cost savings associated with mass assembly. Fully building and testing the data center components on the factory assembly floor also helps to reduce costly design and/or installation errors and helps to exploit economies of scale.

System level testing on the modular data components may be performed by expert testing staff before the modular data components are shipped from the factory. Many other elements that are usually beyond the data center customer's control can be easily monitored. The building of the modular data components on the factory assembly floor would thus result in a better and also more consistent end product.

The use of modular data components allowing for design standardization and a greater amount of control over the assembly and testing processes also provides opportunities to apply advanced cooling and power management monitoring and control systems. The design costs of such cooling and power management monitoring and control systems may be amortized over a large number of modular data components versus the conventional approach that takes into account site-specific constraints and even separate areas within a site.

The use of data center modules may also substantially reduce the time to commission a cluster, e.g., 1 to 2 months.

Modular components are particularly suited for deploying large clusters of individual computers, e.g., over 1,000 computers, although smaller clusters may also enjoy the benefits of utilizing one or more modular components of a modular data center.

The modular data center 10 may be located where real estate is inexpensive such as in former industrial sites, in a yard with a stable and graded surface, at sites near power dams and/or railways with, for example, access to resources such as electricity, natural gas (e.g., for power generation), water (e.g., for cooling), and/or Internet access (e.g., wired including optical connections and/or wireless such as satellite). After the data center modules 12, 14, 16, 20 reach the data center site, the components may then be easily and efficiently connected via connectors 27 to electrical, natural gas, water, Internet access, and/or other connections and/or to each other to form the modular data center 10. The resource hookups may be industrial standard quick connects 27 such that the modular data center and/or each modular component can be quickly and easily installed and removed and/or the hookups may be automated. The data center modules 12, 14, 16, 20 may also be stacked, e.g., up to 8 high, to conserve real estate. Thus the use of modular data centers 10 eliminates many of the logistic difficulties inherent in building data centers at unique and distant sites such as at colocation centers.

In one embodiment, each modular component can be a largely self-contained system. Each modular component may be assembled with the electrical distribution and/or network interconnectivity required by the computing units of the modular components. In some embodiments, the site installation involves only unloading of the modular component(s) from the delivery vehicles and connecting electricity, gas, water, Internet, and/or various other connections. For example, modular component(s) may include a power distribution unit (PDU) for distributing power from a central power source to the computing units and/or a network interface to interface between an Internet access connection and the computing units. Power may be supplied by another modular component containing a co-generating station that may, for example, uses natural gas to supply the electrical and cooling power for the other modular components. Thus the modular data center would contain a built-in system of power generation and distribution.

As is known, a co-generating station is a power generating scheme that uses waste heat from a primary generator driving device for some other purpose. For example, a natural gas may be utilized to fuel a gas turbine to generate electricity. The exhaust from the gas turbine is very hot (e.g., approximately 700° C.) such that water injected into the exhaust flashes into steam and can be run through a steam turbine to power a second generator to generate additional electricity. The exhaust of the steam turbine can be reasonably warm (e.g., approximately 90° C.) and can be used to power a direct absorption refrigeration system. As is evident, the triple use of the various forms of energy can greatly improve efficiency.

By the nature of the modular components, the modular components may be sited within an existing building structure, outdoors exposed directly to the elements, under an overhead protective car-port style roof structure, and/or various other combinations. As shown in FIG. 1, multiple modular component may optionally be connected to each other via a system of additional modules acting as interconnecting hallways, offices, and/or convenience facilities for the use of service employees.

Once deployed, each modular component can be serviced on site with human access. Alternatively or additionally, an entire modular component may be conveniently and easily disconnected and transported to a service center where the modular component can be opened and the contents replaced en masse for upgrades, recycling, etc. It is noted that the modular data center is well suited to be a computing center particularly for large scale deployments, e.g., large scale deployments of generic applications and/or specialized applications.

Figure 2:
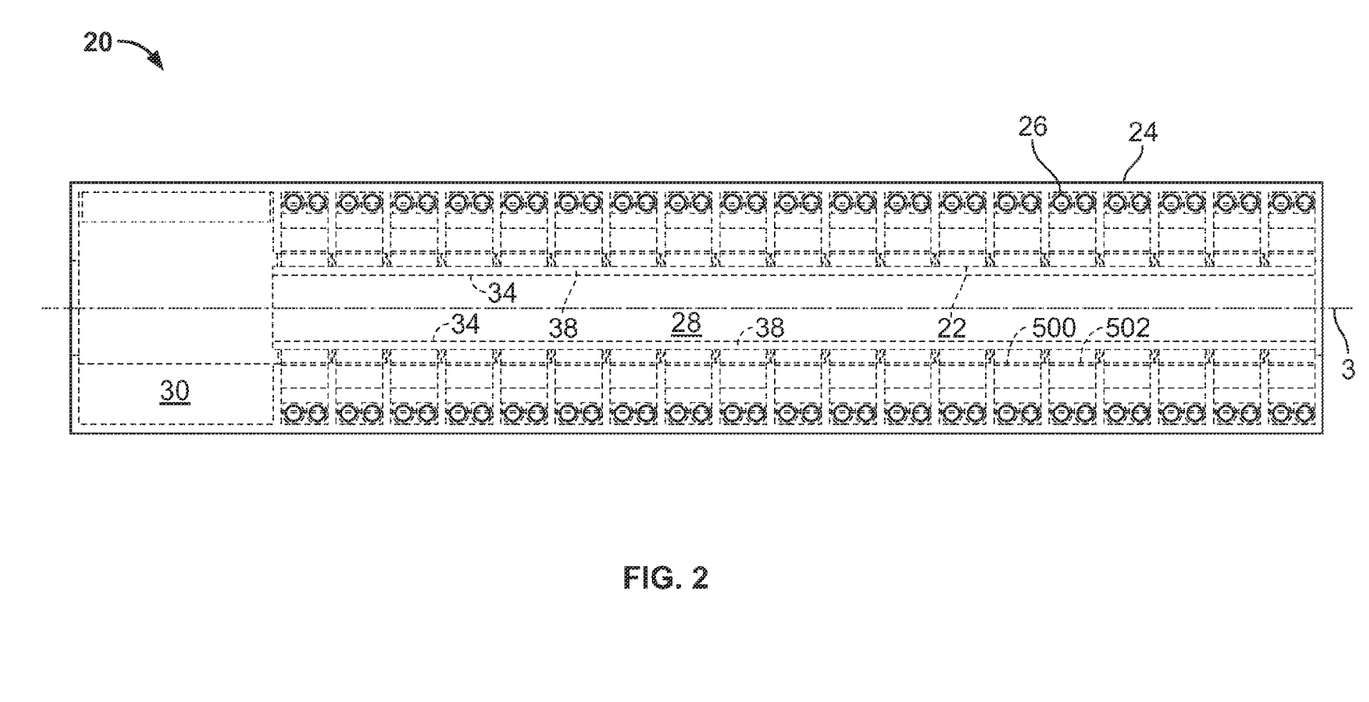
FIG. 2 is a top view of an illustrative implementation of a computing module for use in a modular data center.

FIG. 2 is a top view of an illustrative implementation of a computing module 20 with a longitudinal axis 3 for use in a modular data center. As shown, the computing module 20 may include a number of racks or shelves 22 housed in an intermodal shipping container 24. Each rack or shelf 22 contains several rack and/or shelf mounted computing systems. Various other types of mounting mechanisms for the computing systems may be additionally or alternatively employed. Each rack 22 may be an individual cabinet housed in the container 24. Alternatively, the racks or shelves 22 may be in the form of open bays (e.g., shown as open sides 500 and 502 of the racks) with shelf holders built into the structure of the container 24. Specifically, each rack 22 may include posts that serve as structural components of the container 24 and that carry shelf holders for holding individual computing shelves.

Blower motors 26 may extend from the rack or shelf 22 to expel warm air. As shown, two blower motors 26 may be provided for each rack/shelf 22 depending upon available space, physical limitations, resource limitations, and/or provisions for redundancy. Locating the blower motors 26 outside of the container 24 helps to keep the heat generated by the blower motors 26 outside of the container 24 as well. Although the blower motors 26 are shown extending from the top of the container 24, the blower motors 26 may also extend out from the sides of the container 24 or may be contained within the intermodal shipping container to facilitate transport, for example.

The racks or shelves 22 may be arranged so as to provide a walkway 28 between two rows of the racks/shelves 22 for service access and/or to facilitate temperature and/or humidity control. In addition, a workbench 30 can optionally be provided at one end of the container 24.

Figure 3:
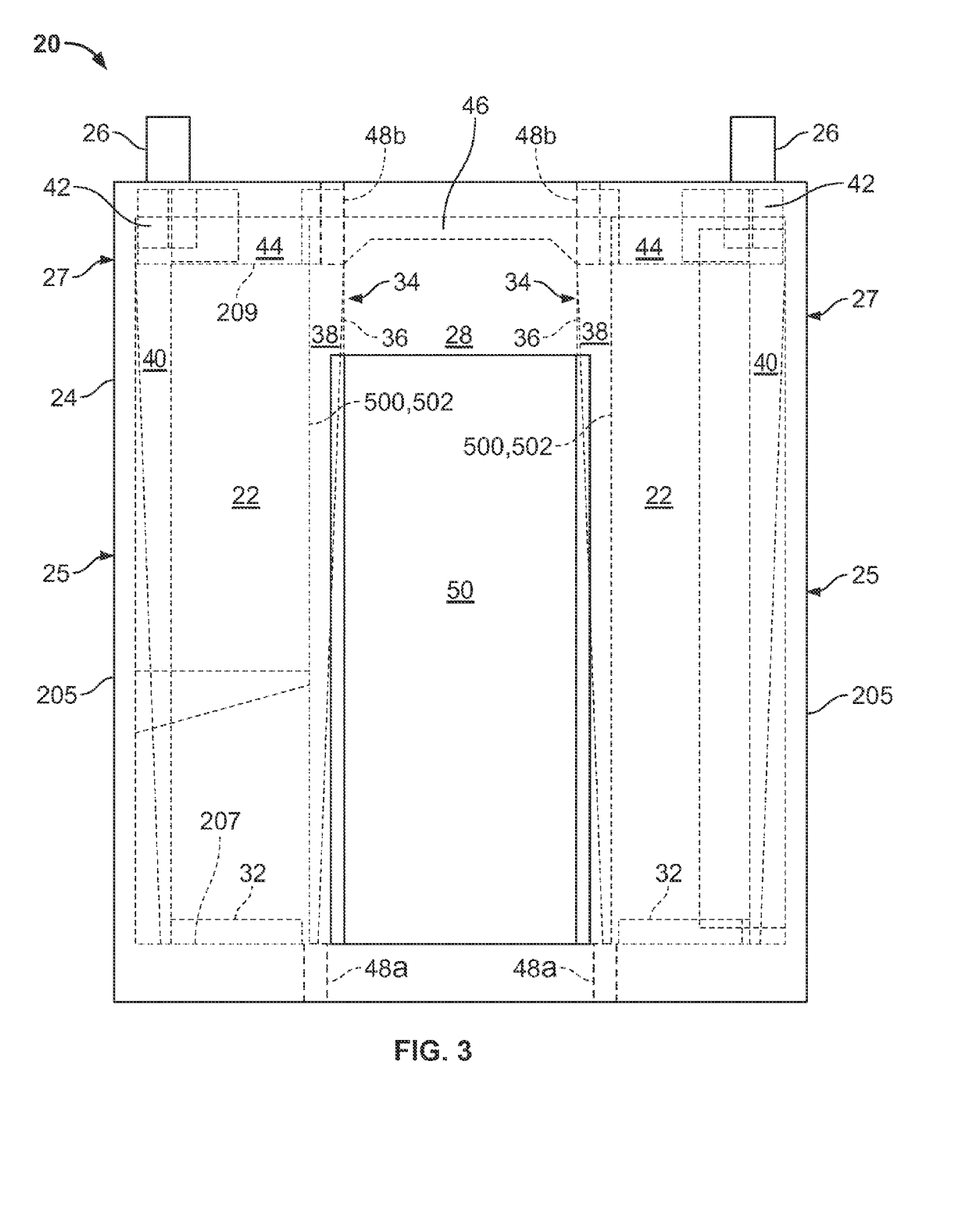
FIG. 3 is a side view of an illustrative implementation of a computing module for use in a modular data center.

FIG. 3 is a side view of an illustrative implementation of a computing module 20 for use in a modular data center. As shown, the computing module 20 may provide a door 50 at one end to provide access for service personnel on-site at the data center location and/or for personnel access at the factory, for example. Doors may be provided at either or both ends and/or at sides, for example. Alternatively or additionally, openings without doors may similarly be provided such as openings that interconnect adjoining intermodal shipping containers. Each rack or shelf 22 includes multiple computing units 32, one of which is shown for each rack/shelf 22 on either side of the computing module 20. As is common, the computing units 32 may be vertically racked or shelved one over the next approximately the entire internal height of the rack/shelf 22.

Preferably, the walls of the container 24 are insulated to facilitate in economically maintaining internal temperatures. Each computing module 20 may implement a built-in refrigerated cooling system to remove waste heat generated by the computing units 32. For example, each rack/shelf 22 may include an enclosure 34 enclosing the computing units 32 contained in the rack/shelf 22 and having a door 36 that can open into the walkway 28 for access by personnel. Each rack/shelf 22 being in its own enclosed environment allows finer granularity of temperature and/or humidity control via a temperature control subsystem corresponding to the rack/shelf 22. The door 36 and the fronts of the computing units 32 may form a front plenum 38. A rear plenum 40 may also be formed between the back of the enclosure 34 and the backs of the computing units 32. The front and rear plenums 38, 40 communicate via spaces between the computing units 32 and facilitate air circulation for purposes of cooling the computing units 32 of the rack/shelf 22, for example.

In particular, the cooling subsystem for each computing unit 32 may generally include an evaporator coil 44 and a blower having the blower motors 26 and blower blades 42 to push warm air over the evaporator coil 44 to cool the warm air. The evaporator coil 44 may be in fluid communication with the condenser output and a compressor suction line, for example. The blower may push cool air into the front plenum 38 (e.g., cold air delivery plenum), over the computing units 32 to cool the computing units 32 and pull warm air through the rear plenum 40 (e.g., warm air return plenum). Alternatively, the blower may push cool air into the rear plenum 40, over the computing units 32 to cool the computing units 32 and pull warm air through the front plenum 38. In one embodiment, the front and rear plenums 38, 40 may be tapered to have a larger cross sectional area near the top of the enclosure 34 than at the bottom of the enclosure 34 in order to compensate for an air pressure gradient that may otherwise be present from the top to the bottom of the enclosure 34. The tapering thus facilitates the cooling system in drawing approximately the same volume of air flow over each computing unit 32 for more even cooling. Other mechanisms may also be employed to facilitate achieving uniform air pressure and thus equalization of the volume of air flow.

Other systems of internal or external water chillers, articulated ventilation panels, and/or other cooling devices, separately or in combination, may also be employed. For example, the computing module 20 may further include an inlet and outlet vents 48a, 48b, respectively, e.g., a gas-side economizer, preferably with dampers that operate in unison. As shown, the economizer inlet vents 48a may be located at the bottom of the module, e.g., to access the cooler air while the economizer outlet vents 48b may be located at or near the top of the module, e.g., to allow warm air to escape. Such a configuration of the economizer inlet and outlet vents 48a, 48b may facilitate in moving warm air out of the module while drawing cooler air in, similar to a chimney.

The blowers may be utilized to cooperate with the inlet and outlet vents 48a, 48b to move outside air through each rack/shelf 22 of the computing module 20. In addition, water vapor may also be added to outside air, for example, if the ambient air temperature is very cold or if the ambient air is otherwise very dry, in order to maintain a desired relative humidity inside the module. The inlet and outlet vents may utilize outside air when the outside air is cooler, e.g., 10° F. or more cooler than the desired internal temperature to satisfy at least some of the cooling needs of the computing module 20. For example, the inlet and outlet vents may be in thermal communication with a crawlspace under the container 24 if, for example, the container 24 is secured to a concrete foundation forming the crawlspace. As another example, the inlet and outlet vents may extend through side walls and/or ceiling of the container 24.

The computing module 20 may further provide a wire race 46 for housing, for example, Cat 5 cables, electrical and/or various other cables. The wire race 46 may run approximately the length of the container 24 above the walkway 28. However, various other configurations may also be employed. The computing module 20 may also include a power distribution unit (PDU) to distribute power among the racks/shelves 22.

The computing module 20 may also provide motion sensors (not shown) to detect motion along the walkway 28, e.g., to sense the presence of a service technician, for example. The motion sensors may be in communication with light switches and/or fresh air vents, for example, such that when a service technician enters the computing module 20, the motion sensors automatically causes the lights to turn on and the fresh air vents to open to provide light and fresh air in the computing module 20. In order to conserve energy, the motion sensors may automatically turn off the lights and close the fresh air vents after absence of detecting motion for a predetermined period of time, e.g., 5 minutes.

It is noted that in FIGS. 1-3, components of the modular data center 10 such as the computing module 20 in FIGS. 2 and 3 may not be drawn to scale.

Figure 4:
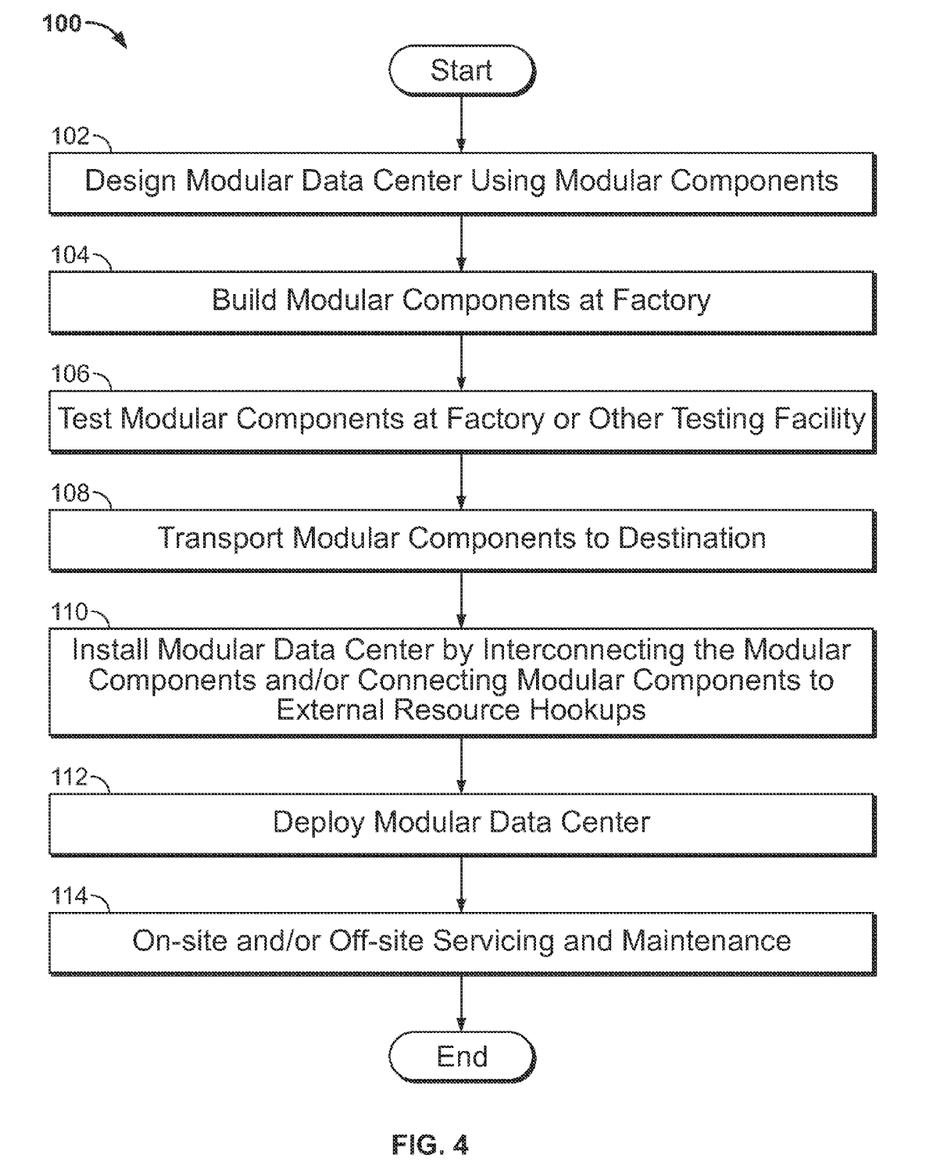
FIG. 4 is a flowchart of an illustrative process for constructing and deploying a modular data center.

FIG. 4 is a flowchart of an illustrative process 100 for constructing and deploying a modular data center containing one or more modular components. At block 102, a modular data center is designed using modular components. The modular data center may include one or more modular components and the modular components may include, for example, computing modules, office modules, power and/or cooling modules, and/or cooling towers. The computing module may also be a largely self-contained system.

The modular components of the modular data center are built at a factory or other centralized build facilities at block 104. The modular components can be tested either at the same factory or at a separate testing facility at block 106. The modular components are then transported to the destination at block 108. Because most if not all of the modular components are self-contained within an intermodal shipping container of the same or various sizes, transporting the modular components can be easily achieved utilizing the existing worldwide road, rail, and/or vessel container handling infrastructure.

At block 110, the modular components are interconnected and/or connected to external resources such as electricity, natural gas, water, and/or Internet connections to form the modular data center. At block 112, the modular data center is deployed and placed into operation. At block 114, servicing and/or maintenance of the modular components may be performed on-site and/or off-site. For off-site servicing and/or maintenance, the respective modular component can be disconnected from other modular component(s) and/or various resource connections and transported to a servicing facility, e.g., the build factory or facility or a separate maintenance facility, and then returned to the original. Alternatively, a new replacement modular component can be brought to the site and the modular component being replaced can be disconnected and transported to a servicing facility, e.g., the build facility, and optionally placed back into service at the same or a different site. In particular, as each modular component reaches the end of its service life, the modular component may be disconnected from the remainder of the modular data center and removed from the site and a replacement modular component may be installed as a replacement. Similarly, as each rack/shelf and/or computing unit within the computing module reaches the end of its service life, that rack/shelf and/or computing unit may be disconnected from the remainder of the computing module and removed from the data center site and a replacement rack/shelf and/or computing unit may be installed as a replacement. Such a modular-method of servicing the modular data center also takes advantage of the use of modular components and the use of intermodal shipping containers.

Furthermore, the modular data center facilitates rapid and easy relocation to another site depending on changing economic factors, for example. The modular data center thus helps to make the moving of a data center more cost effective and thus more economically feasible. In one implementation, a modular system may reduce the cost of moving by approximately 60 to 80% to provide more viable options even within the nominal life of a module.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A computing device cooling apparatus, comprising:
an enclosure defining an interior space of a data center and comprising at least one server rack opening on a first side of a server rack configured to engage a computing module assembly, the computing module assembly installed in the server rack and open to the interior space through the first side of the server rack, the enclosure comprising a modular container that encloses at least one row of server racks that comprise the server rack, and a human-occupiable aisle adjacent the at least one row of server racks, within the interior space; and
a cooling module at least partially mounted on a top surface of the enclosure, the cooling module configured to supply cooling air to the interior space to remove heat from the computing module assembly,
wherein the cooling module comprises a blower, a blower motor coupled to the blower, and a cooling coil, the blower and the cooling coil mounted within the interior space of the enclosure and adjacent the server rack, the blower motor mounted on the top surface of the enclosure and coupled to the blower through the enclosure.

2. The computing device cooling apparatus of claim 1, wherein the at least one server rack opening is coplanar with an outer periphery of the server rack.

3. The computing device cooling apparatus of claim 2, wherein the cooling air is circulated through the server rack from the outer periphery through the first side and over the computing module assembly.

4. The computing device cooling apparatus of claim 3, wherein the server rack is substantially sealed against fluid communication with an adjacent server rack.

5. The computing device cooling apparatus of claim 1, wherein the cooling module further comprises:
one or more dampers configured to adjust a flow of air in and out of the enclosure; and
a temperature control system configured to control operation of the cooling module.

6. The computing device cooling apparatus of claim 5, wherein the dampers are controlled by the temperature control system.

7. The computing device cooling apparatus of claim 1, wherein liquid is used inside the cooling coil to cool ambient air.

8. The computing device cooling apparatus of claim 1, wherein the server rack opening comprises one or more racks on which one or more servers is placed.

9. A server cooling room, comprising:
one or more openings comprising a fluid pathway between a server cooling room and an outdoor environment for air exchange between the server cooling room and the outdoor environment, the server cooling room comprising a modular container that encloses rows of server racks and a human-occupiable aisle between the rows of server racks, the one or more openings comprising one or more dampered outside air intake openings and one or more dampered exhaust air openings;

one or more server racks, within the rows of server racks, mounted in the server cooling room that support a plurality of servers; and a server cooling apparatus in fluid communication with the one or more openings, each server cooling apparatus comprising:

an enclosure defining an interior space of the server cooling room and comprising at least one server rack opening on a first side of one of the one or more server racks, the server rack configured to engage one or more server trays that support the plurality of servers that are open to the interior space through the first side of the server rack; and a cooling module at least partially mounted on a top surface of the enclosure, the cooling module configured to supply cooling air to the interior space to remove heat from the plurality of the servers, the cooling module comprising a cooling device operable to cool air supplied to the interior space, the cooling device comprising one or more cooling coils mounted above the server rack within the interior space and in airflow communication with one or more fans of the cooling module that are mounted above the server rack within the interior space, the one or more fans coupled to respective electric motors mounted external to the enclosure.

10. The server cooling room of claim 9, further comprising at least one server rack port that is configured to interface with the one or more server racks such that a front face of the one or more server racks intersects the interior space.

11. The server cooling room of claim 9, wherein the one or more dampered outside air intake openings and one or more dampered exhaust air openings are responsive to a temperature control unit.

12. The server cooling room of claim 9, wherein the one or more cooling fans are operable to draw cold air from the cooling module.

13. The server cooling room of claim 9, wherein the at least one server rack opening is coplanar with an outer periphery of the server rack.

14. The server cooling room of claim 13, wherein the cooling air is circulated through the server rack from the outer periphery through the first side and over the portion of servers.

15. The server cooling room of claim 14, wherein the server rack is substantially sealed against fluid communication with an adjacent server rack.

16. The server cooling room of claim 9, wherein the cooling device further comprises:

a temperature control unit operable to control operation of the cooling module.

17. The server room of claim 16, further comprising chilled liquid circulated inside the one or more cooling coils to cool ambient air.

18. The server room of claim 16, wherein the temperature control unit is operable to control one or more fans operable to circulate the cooled ambient air.

19. The server room of claim 9, wherein each of the one or more openings is fluidly connected to a plurality of the cooling modules.

20. A server cooling method, comprising:

substantially enclosing an interior space having at least one lateral portion defined by a front face of at least one server rack, the interior space enclosed within a modular data center container that comprises a human-occupiable aisle adjacent rows of server racks that comprise the at least one server rack;

supporting a plurality of servers in the at least one server rack;

introducing a flow of cooling air from a top cover of the interior space by one or more cooling fans in fluid communication with a volume in the server rack that includes the plurality of servers;

circulating the cooling air from a cooling air assembly through the interior space and through the volume to cool the servers, wherein circulating the cooling air from the cooling assembly comprises:

powering a blower that is mounted within the interior space with a blower motor that is mounted on top of the modular data center container, circulating the cooling air from the blower through a cooling coil mounted in the interior space, and circulating the cooling air from the cooling coil to the volume;

determining an ambient air temperature; and based on the determined ambient air temperature, circulating ambient air into the interior space through one or more dampered outside air openings in the modular data center container, and circulating exhaust air out of the interior space through one or more dampered exhaust air openings in the modular data center container.

21. The method of claim 20, wherein the server rack is attached to adjacent server racks in the interior space.

22. The method of claim 21, wherein the attachment between the server racks is substantially sealed.

23. The method of claim 22, wherein circulating the cooling air from a cooling air assembly through the interior space and through the volume to cool the servers comprises circulating substantially no cooling air between the server racks.

24. The method of claim 20, wherein the cooling air assembly comprises:

one or more outside air dampers operable to adjust the flow of ambient air in and out of the interior space; and a temperature control unit for controlling the outside air dampers.

25. The method of claim 20, further comprising circulating a cooling liquid through the cooling coil to cool the ambient air.

* * * * *